(12) United States Patent
McCollum et al.

(10) Patent No.: US 11,544,349 B2
(45) Date of Patent: Jan. 3, 2023

(54) METHOD FOR COMBINING ANALOG NEURAL NET WITH FPGA ROUTING IN A MONOLITHIC INTEGRATED CIRCUIT

(71) Applicant: Microsemi SoC Corp., Chandler, AZ (US)

(72) Inventors: John L. McCollum, Orem, UT (US); Jonathan W. Greene, Palo Alto, CA (US); Gregory William Bakker, San Jose, CA (US)

(73) Assignee: Microsemi SoC Corp., Chandler, CA (US)

(*) Notice: Subject to any disclaimer, the term of this patent is extended or adjusted under 35 U.S.C. 154(b) by 156 days.

(21) Appl. No.: 17/232,075

(22) Filed: Apr. 15, 2021

(65) Prior Publication Data

US 2021/0232658 A1 Jul. 29, 2021

Related U.S. Application Data

(62) Division of application No. 16/353,409, filed on Mar. 14, 2019, now Pat. No. 11,023,559.

(Continued)

(51) Int. Cl.
*G06F 17/16* (2006.01)
*G06G 7/161* (2006.01)
(Continued)

(52) U.S. Cl.
CPC ............ *G06F 17/16* (2013.01); *G06G 7/161* (2013.01); *G06G 7/22* (2013.01); *G06N 3/04* (2013.01); *G06N 3/0635* (2013.01)

(58) Field of Classification Search
CPC .... G06G 7/16–161; G06G 7/22; G06F 17/16; G06N 3/04; G06N 3/0635
See application file for complete search history.

(56) References Cited

U.S. PATENT DOCUMENTS 4,810,910 A 3/1989 Schoellikopf et al.
4,904,881 A 2/1990 Castro
(Continued)

FOREIGN PATENT DOCUMENTS

EP 0566739 A1 10/1993
EP 0562737 B1 6/1998
(Continued)

OTHER PUBLICATIONS

Long, et al., "ReRAM-Based Processing-in-Memory Architecture for Recurrent Neural Network Acceleration," IEEE Transactions on Very Large Scale Integration (VLSI) Systems, vol. 26, No. 12, pp. 2781-2794, Dec. 2018.

(Continued)

*Primary Examiner* — Matthew D Sandifer
(74) *Attorney, Agent, or Firm* — Glass and Associates; Kenneth D'Alessandro; Kenneth Glass (57) ABSTRACT

A method for implementing a neural network system in an integrated circuit includes presenting digital pulses to word line inputs of a matrix vector multiplier including a plurality of word lines, the word lines forming intersections with a plurality of summing bit lines, a programmable Vt transistor at each intersection having a gate connected to the intersecting word line, a source connected to a fixed potential and a drain connected to the intersecting summing bit line, each digital pulse having a pulse width proportional to an analog quantity. During a charge collection time frame charge collected on each of the summing bit lines from current flowing in the programmable Vt transistor is summed. During a pulse generating time frame digital pulses are generated having pulse widths proportional to the amount of charge that was collected on each summing bit line during the charge collection time frame.

2 Claims, 8 Drawing Sheets

Related U.S. Application Data (60) Provisional application No. 62/797,158, filed on Jan. 25, 2019.

(51) Int. Cl.
  *G06G 7/22* (2006.01)
  *G06N 3/04* (2006.01)
  *G06N 3/063* (2006.01)

(56) References Cited

U.S. PATENT DOCUMENTS

| | | |
|---|---|---|
| 4,950,917 A | 8/1990 | Holler et al. |
| 4,961,002 A | 10/1990 | Tam et al. |
| 5,028,810 A | 7/1991 | Castro et al. |
| 5,029,130 A | 7/1991 | Yeh |
| 5,055,897 A | 10/1991 | Canepa et al. |
| 5,093,900 A | 3/1992 | Graf |
| 5,097,441 A | 3/1992 | Cho et al. |
| 5,138,576 A | 8/1992 | Madurawe |
| 5,146,602 A | 9/1992 | Holler et al. |
| 5,150,450 A | 9/1992 | Swenson et al. |
| 5,242,848 A | 9/1993 | Yeh |
| 5,256,911 A | 10/1993 | Holler et al. |
| 5,264,734 A | 11/1993 | Holler et al. |
| 5,298,796 A | 3/1994 | Tawel |
| 5,336,936 A | 8/1994 | Allen et al. |
| 5,386,132 A | 1/1995 | Wong |
| 5,469,397 A | 11/1995 | Hoshino et al. |
| 5,509,106 A | 4/1996 | Pechanek et al. |
| 5,554,874 A | 9/1996 | Doluca |
| 5,621,336 A | 4/1997 | Shibata et al. |
| 5,643,814 A | 7/1997 | Chung |
| 5,721,702 A | 2/1998 | Briner |
| 5,748,534 A | 5/1998 | Dunlap et al. |
| 5,914,894 A | 6/1999 | Diorio et al. |
| 5,966,332 A | 10/1999 | Takano |
| 5,990,512 A | 11/1999 | Diorio et al. |
| 6,222,777 B1 | 4/2001 | Khieu |
| 6,232,180 B1 | 5/2001 | Chen |
| 6,282,119 B1 | 8/2001 | Tsen |
| 6,389,404 B1 | 5/2002 | Carson et al. |
| 6,683,645 B1 | 1/2004 | Collins et al. |
| 6,747,310 B2 | 6/2004 | Fan et al. |
| 6,829,598 B2 | 12/2004 | Milev |
| 7,315,056 B2 | 1/2008 | Klinger et al. |
| 7,868,375 B2 | 1/2011 | Liu et al. |
| 10,217,512 B1 | 2/2019 | Leobandung |
| 10,269,440 B2 | 4/2019 | Guo et al. |
| 10,388,389 B2 | 8/2019 | Guo et al. |
| 10,715,307 B1 | 7/2020 | Jin |
| 10,720,217 B1 | 7/2020 | Tran et al. |
| 10,748,630 B2 | 8/2020 | Tran et al. |
| 10,803,943 B2 | 10/2020 | Tran et al. |
| 11,023,559 B2 | 6/2021 | McCollum et al. |
| 11,087,207 B2 | 8/2021 | Tran et al. |
| 11,270,763 B2 | 3/2022 | Tran et al. |
| 11,270,771 B2 | 3/2022 | Tran et al. |
| 2002/0089014 A1 | 7/2002 | Chern |
| 2003/0034510 A1 | 2/2003 | Liu et al. |
| 2003/0052360 A1 | 3/2003 | Guterman et al. |
| 2003/0183871 A1 | 10/2003 | Dugger et al. |
| 2004/0095809 A1 | 5/2004 | Sakamoto et al. |
| 2004/0125655 A1 | 7/2004 | Tsai et al. |
| 2004/0150032 A1 | 8/2004 | Wu |
| 2004/0155234 A1 | 8/2004 | Ishimaru et al. |
| 2004/0156241 A1 | 8/2004 | Mokhlesi et al. |
| 2004/0251949 A1 | 12/2004 | Shi et al. |
| 2005/0087892 A1 | 4/2005 | Hsu et al. |
| 2005/0122238 A1 | 6/2005 | Nomura et al. |
| 2006/0104120 A1 | 5/2006 | Hemink |
| 2006/0170038 A1 | 8/2006 | Wong et al. |
| 2007/0171756 A1 | 7/2007 | Lambrache et al. |
| 2008/0304345 A1 | 12/2008 | Kwean |
| 2009/0103361 A1 | 4/2009 | Wang |
| 2009/0109760 A1 | 4/2009 | Nazarian et al. |
| 2009/0154246 A1 | 6/2009 | Liu et al. |
| 2009/0192958 A1 | 7/2009 | Todorokihara |
| 2010/0046299 A1 | 2/2010 | Roohparvar |
| 2010/0290292 A1 | 11/2010 | Tanizaki et al. |
| 2011/0161625 A1 | 6/2011 | Pechanek |
| 2011/0235419 A1 | 9/2011 | Ishimaru et al. |
| 2012/0068872 A1 | 3/2012 | Baker |
| 2012/0087188 A1 | 4/2012 | Hsieh et al. |
| 2012/0136913 A1 | 5/2012 | Duong et al. |
| 2013/0044544 A1 | 2/2013 | Shiino et al. |
| 2013/0100756 A1 | 4/2013 | Liao et al. |
| 2014/0054667 A1 | 2/2014 | Tkachev |
| 2014/0140132 A1 | 5/2014 | Gu |
| 2014/0269062 A1 | 9/2014 | Do et al. |
| 2014/0310220 A1 | 10/2014 | Chang et al. |
| 2015/0106315 A1 | 4/2015 | Birdwell et al. |
| 2015/0138183 A1 | 5/2015 | Kishi et al. |
| 2015/0178619 A1 | 6/2015 | Nishitani et al. |
| 2015/0199963 A1 | 7/2015 | Maaninen |
| 2015/0213898 A1 | 7/2015 | Do |
| 2015/0262055 A1 | 9/2015 | Akopyan et al. |
| 2015/0324691 A1 | 11/2015 | Dropps et al. |
| 2016/0042790 A1 | 2/2016 | Tran et al. |
| 2016/0048755 A1 | 2/2016 | Freyman et al. |
| 2016/0093382 A1 | 3/2016 | Sakamoto et al. |
| 2016/0133639 A1 | 5/2016 | Tran et al. |
| 2016/0180945 A1 | 6/2016 | Ng et al. |
| 2016/0254269 A1 | 9/2016 | Kim et al. |
| 2017/0330070 A1 | 11/2017 | Sengupta et al. |
| 2017/0337466 A1 | 11/2017 | Bayat et al. |
| 2017/0337971 A1 | 11/2017 | Tran et al. |
| 2017/0337980 A1 | 11/2017 | Guo et al. |
| 2018/0004708 A1 | 1/2018 | Muralimanohar et al. |
| 2018/0095930 A1 | 4/2018 | Lu et al. |
| 2018/0165573 A1 | 6/2018 | Hsu et al. |
| 2018/0174034 A1 | 6/2018 | Obradovic et al. |
| 2018/0268912 A1 | 9/2018 | Guo et al. |
| 2018/0293487 A1 | 10/2018 | Copel et al. |
| 2019/0019538 A1 | 1/2019 | Li et al. |
| 2019/0019564 A1 | 1/2019 | Li et al. |
| 2019/0042199 A1 | 2/2019 | Sumbul et al. |
| 2019/0088325 A1 | 3/2019 | Wu et al. |
| 2019/0088329 A1 | 3/2019 | Tiwari et al. |
| 2019/0095779 A1 | 3/2019 | Leobandung |
| 2019/0205729 A1 | 7/2019 | Tran et al. |
| 2019/0213234 A1 | 7/2019 | Bayat et al. |
| 2019/0237136 A1 | 8/2019 | Tran et al. |
| 2019/0278675 A1 | 9/2019 | Bolkhovitin et al. |
| 2019/0286976 A1 | 9/2019 | Tran et al. |
| 2019/0294416 A1 | 9/2019 | Hu et al. |
| 2020/0020393 A1 | 1/2020 | Al-Shamma |
| 2020/0151543 A1 | 5/2020 | Bayat et al. |
| 2020/0201751 A1 | 6/2020 | Wei |
| 2020/0233482 A1 | 7/2020 | Tran et al. |
| 2020/0233923 A1* | 7/2020 | Knag .................. G11C 8/08 |
| 2020/0234111 A1 | 7/2020 | Tran et al. |
| 2020/0342938 A1 | 10/2020 | Tran et al. |
| 2021/0019609 A1* | 1/2021 | Strukov ............ G11C 16/0416 |
| 2021/0232893 A1 | 7/2021 | Bayat et al. |

FOREIGN PATENT DOCUMENTS

| | | |
|---|---|---|
| JP | 63261784 | 10/1988 |
| TW | 201837759 A | 10/2018 |
| WO | 2017131653 A1 | 8/2017 |
| WO | 2018201060 A1 | 11/2018 |

OTHER PUBLICATIONS

Mister Hamilton, et al., "Integrated Pulse Stream Neural Networks: Results, Issues, and Pointers," IEEE Transactions on Neural Networks, May 1992.

Bavandpour, et al., "Energy-Efficient Time-Domain Vector-by-Matrix Multiplier for Neurocomputing and Beyond," retrieved from the Internet: url:https://arxiv.org/pdf/1711.10673.pdf, pp. 1-6.

Bayat, "Memory Technologies for Neural Networks," IEEE, 2015.

(56) References Cited

OTHER PUBLICATIONS

Fowler, et al., "Pulse-Modulated Analog Neuron Circuits," pp. 1-8, Department of Electrical Engineering, Stanford Jniversity, received on Oct. 1, 1992; revised on Aug. 2, 1993.

Guo, et al., "Temperature-insensitive Analog Vector-by-Matrix Multiplier Based on 55nm NOR Flash Memory Cells," IEEE Custom Integrated Circuits Conference, Apr. 30, 2017, pp. 1-14.

Jenn-Chyou Bor, et al., "Realization of the CMOS Pulse Width-Modulation (PWM) Neural Network with On-Chip Learning," IEEE Transactions on Circuits and Systems, Jan. 1998.

Lin, et al., "A Novel Voltage-Accumulation Vector-Matrix Multiplication Architecture Using Resistor-shunted Floating Sate Flash Memory Device for Low-power and High-density Neural Network Applications," IEEE International Electron Devices Meeting, Dec. 1, 2018, pp. 2.4.1-2.4.4.

Liu, et al., "A Memristor CrossBar Based Computing Engine Optimized for High Speed and Accuracy," 2016 IEEE Computer Society Annual Symposium on VLSI (ISVLSI), Pittsburgh, PA, pp. 110-115.

Mehrotra, "Elements of Artificial Neural Networks," MIT Press, 1997.

PCT/US2019/043090, International Search Report and Written Opinion of the International Searching Authority, dated Nov. 6, 2019.

Shafiee et al., "Isaac: A convolutional Neural Network Accelerator With In-Situ Analog Arithmetic in Crossbars;" 2016 ACM/IEEE 43rd Annual International Symposium on Computer Architecture, Seoul, Oct. 2016.

Yakoub et al., "A Neuromimetic Ultra Low-Power ADC for Bio-Sensing Applications," pp. 1-4, Polystim Neurotechnologies Laboratory, Ecole Polytechnique, Montreal, Canada.

Bor, et al., "Realization of the CMOS Pulsewidth-Modulation(PWM) Neural Network with On-Chip Learning", IEEE Fransactions on Circuits and Systems-II: Analog and Digital Signal Processing, vol. 45, No. 1, pp. 96-107, Jan. 1, 1998.

Hamilton, et al., "Integrated Pulse Stream Neural Networks: Results, Issues, and Pointers", IEEE Transactions on Neural Networks, vol. 3, No. 3, pp. 385-393, May 1992.

* cited by examiner

METHOD FOR COMBINING ANALOG NEURAL NET WITH FPGA ROUTING IN A MONOLITHIC INTEGRATED CIRCUIT

BACKGROUND

The present invention relates to integrated circuit technology. More particularly, the present invention relates to analog neural networks and to combining analog neural networks with field programmable gate array technology.

Neural networks are built by connecting together several functions including matrix-vector products, rectification (RELU activation function), and a maximum of a set of values (max pooling). An ideal neural network integrated circuit could connect these functions together in a programmable manner.

Building a neural network using digital computation is unsatisfactory because it consumes unreasonable amounts of power. Analog Based Neural Network integrated circuits are efficient at calculating the terms for each layer. The neural network functions are implemented in the analog domain in each layer, but problems arise in routing the analog voltage levels to the next layer. Analog computation of neural network functions consumes less power, but routing a variable voltage is difficult as buffering requires the use of operational amplifiers which introduce errors, and consumes both significant die area and static power. Such routing is currently designed and hardwired into each integrated circuit individually for each application, making it expensive and inflexible. This routing is currently done at the fabrication level.

Incorporating processing in the digital domain can be an attractive alternative to-an all-analog neural network system. It is, however, very expensive to convert back and forth between the digital domain and the analog domain. In addition such conversions slow down a system as well as providing an opportunity to introduce errors into the computations.

Figure 1:
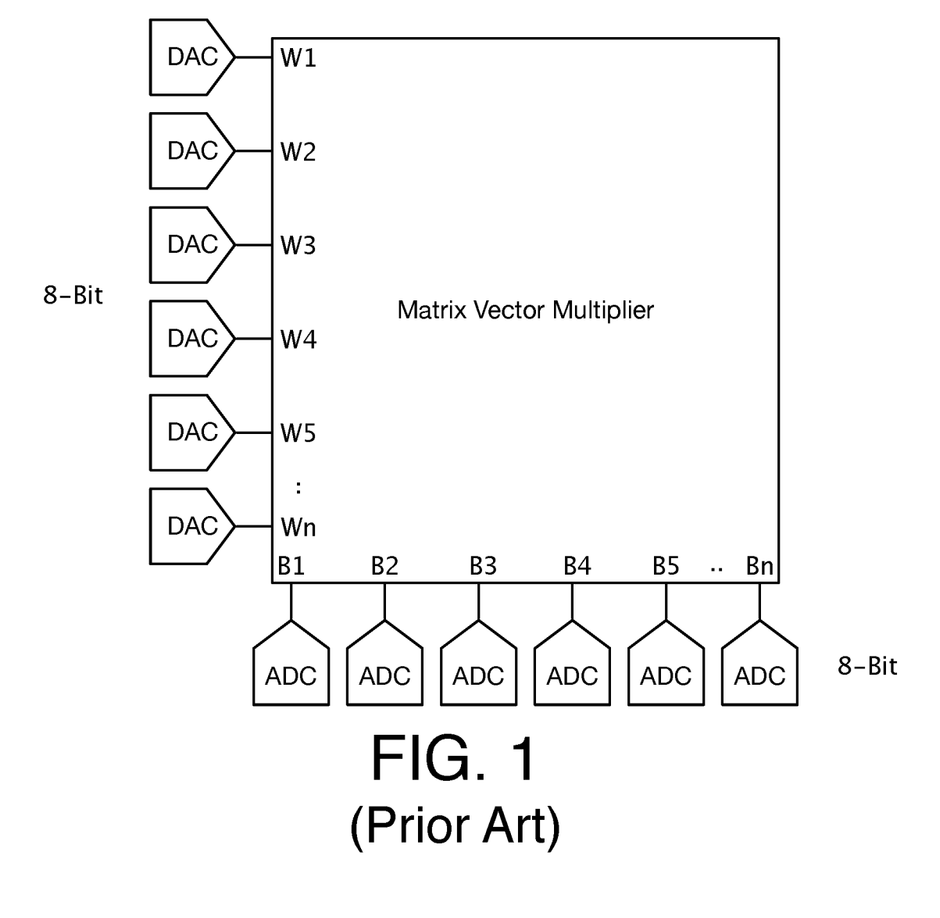
FIG. 1 is a block diagram of an example of a prior-art matrix vector multiplier unit.

FIG. 1 is a block diagram depicting an example of a prior-art matrix vector multiplier unit having input and output digital interfaces. A single integrated circuit will typically contain many of these matrix vector multipliers.

The input interfaces for this prior-art matrix vector multiplier unit are in the form of digital-to-analog (converters (DACs) having analog outputs coupled to the word line inputs W1 through Wn to the matrix vector multiplier unit and the output interfaces are in the form of analog-to-digital converters (ADCs) coupled to the bit lines B1 through Bn of the matrix vector multiplier unit. In one instance of this prior-art implementation both the DACs and the ADCs are 8-bit resolution. The weights are programmed as variable conductances (using for example programmable transistors such as Flash devices) in the matrix vector multiplier and represent the neural network weights. The inputs to the matrix vector multiplier unit are provided by the DACs, producing currents that are the product of the input signal voltage and the variable conductance weights.

When DACs and ADCs having 8-bit resolution are used, over four decades of linearity are required including the about two decades of applied voltage resolution from the 8-bit DAC resolution and assuming about two decades of the 8-bit variable conductance weight resolution when operating in the linear portion of the variable conductance transfer curve. One problem with this scheme occurs when the input voltage is at the high end of the 8-bit range and the programmed variable conductance is at the low end of the transfer curve. Because the low end of the variable conductance transfer curve is non-linear, the accuracy of the matrix vector multiplier unit suffers the most when the input voltage is at the high end of the 8-bit range and the programmed variable conductance is at the low end of the transfer curve.

BRIEF DESCRIPTION

The present invention is based on the fact that an FPGA is well suited for routing analog time in the form of a variable pulse width.

Each layer of a neural network includes a matrix multiplier that multiplies analog input values on each word line by a multiplier weight on each bit line to generate a dot product and then sums the dot products on each bit line. Conversion from voltage to time employs a capacitor charged to an analog voltage which capacitor is discharged by a current source and generates a pulse having a width representing the analog voltage (an analog time pulse) triggered by a comparator coupled to the capacitor. All of these elements are simple small circuits. The reverse is then used to convert the routed analog time pulse back to an analog voltage. Additional circuits can be added for more speed and accuracy.

In one embodiment a word line is pulsed with an analog time pulse at a constant voltage with the multiplier weight coming from the threshold voltage (Vt) setting on a non-volatile transistor and eliminates the over four decades of linearity required for some alternative mixed analog/digital solutions like the one mentioned above. This eliminates the digital-to-analog input conversion and reduces errors while giving the desired function with a single applied voltage.

According to one aspect of the present invention, a user programmable integrated circuit includes a user-programmable routing network including a plurality of interconnect conductors selectively couplable to one another by user-programmable elements. A plurality of matrix vector multipliers, each have a plurality of word lines, each word line coupled to a different first one of the interconnect conductors of the user-programmable routing network, the word lines forming intersections with a plurality of summing bit lines, a programmable Vt transistor at each intersection having a gate connected to the intersecting word line, a source connected to a fixed potential and a drain connected to the intersecting summing bit line. A charge-to-pulse-width converter circuit is associated with each one of the matrix vector multipliers, each having an input coupled to one of the summing bit lines, and a pulse output coupled to a different second one of the interconnect conductors of the user-programmable routing network.

According to an aspect of the present invention, a method for implementing a neural network system in an integrated circuit includes presenting digital pulses to word line inputs of a matrix vector multiplier including a plurality of word lines, the word lines forming intersections with a plurality of summing bit lines, a programmable Vt transistor at each intersection having a gate connected to the intersecting word line, a source connected to a fixed potential and a drain connected to the intersecting summing bit line, each digital pulse having a pulse width proportional to an analog quantity, during a charge collection time frame summing charge collected on each of the summing bit lines from current flowing in the programmable Vt transistor, and during a pulse generating time frame generating digital pulses having pulse widths proportional to the amount of charge that was collected on each summing bit line during the charge collection time frame.

BRIEF DESCRIPTION OF THE DRAWING FIGURES

The invention will be explained in more detail in the following with reference to embodiments and to the drawing in which are shown.

DETAILED DESCRIPTION

Persons of ordinary skill in the art will realize that the following description is illustrative only and not in any way limiting. Other embodiments will readily suggest themselves to such skilled persons.

The present invention uses a switching array similar to that used in FPGAs. Because routing the neural network analog voltages is difficult and expensive, requiring a large number of large power consuming unity gain amplifiers at every switch point, the present invention solves this problem by converting the analog quantities to analog timing pulses which are routed though the switch points.

Figure 2:
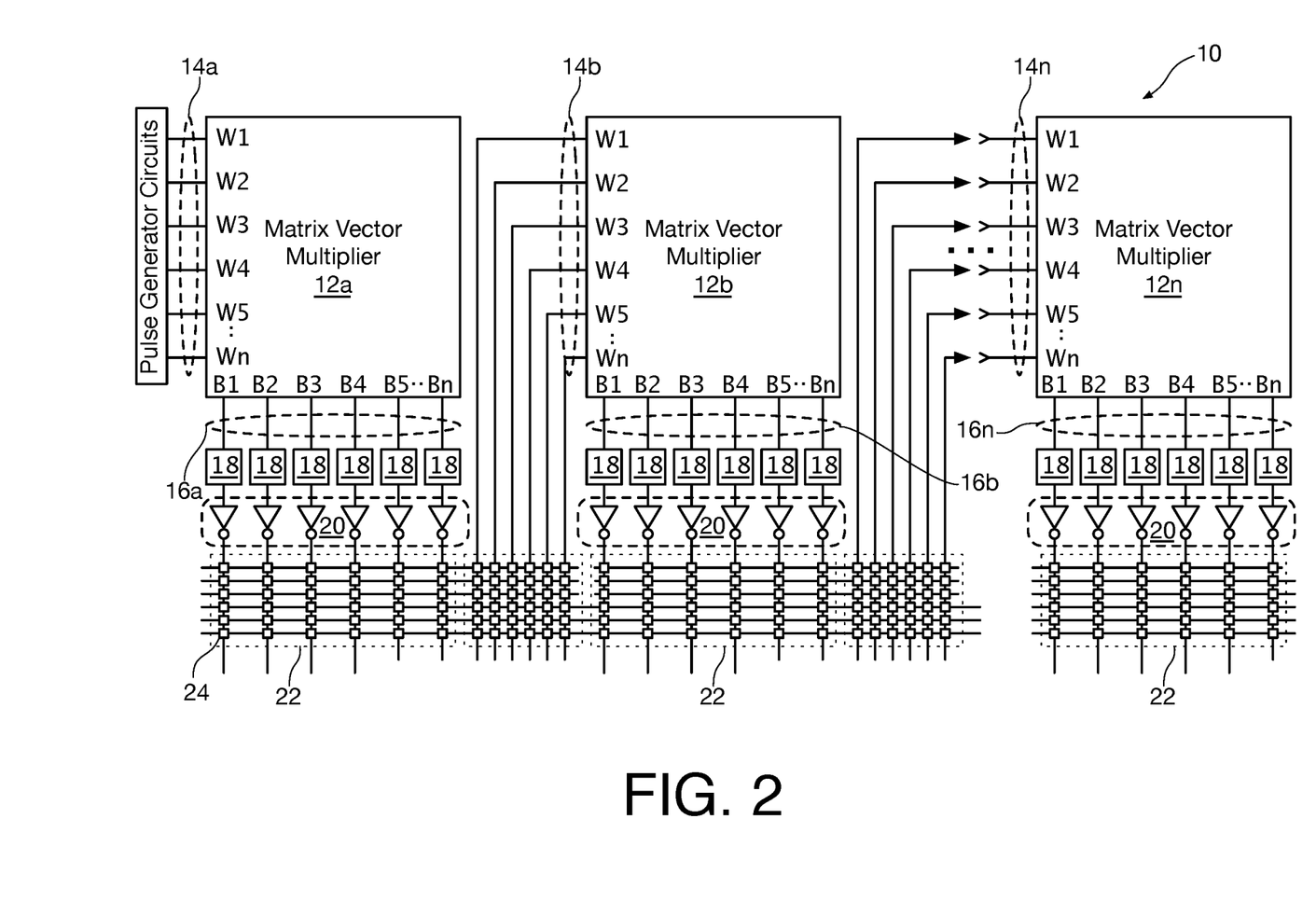
FIG. 2 is a block diagram of a plurality of matrix vector multiplier units cascaded with one another in accordance with an aspect of the present invention.

Referring first of all to FIG. 2, a block diagram shows a neural network system 10 including a plurality of cascaded matrix vector multipliers 12a, 12b, . . . 12n. Each one of the cascaded matrix vector multipliers 12a, 12b, . . . 12n is a matrix having a plurality of word line (W) inputs 14 identified as W1, W2 . . . Wn and a plurality of bit line outputs 16a, 16b, . . . 16n identified as B1, B2 . . . Bn. Neural network system 10 is being illustrated with word line inputs and bit line outputs, it being understood that in certain embodiments bit lines may be used as inputs and word lines may be used as outputs, without exceeding the scope.

Each bit line output is connected to a respective charge-to-pulse-width converter circuit 18. The outputs of the respective charge-to-pulse-width converter circuits 18 are buffered by inverters collectively identified by reference numeral 20 and then presented to a programmable routing network identified within dashed lines 22, which in the particular embodiment shown in FIG. 2 is illustrated as a crossbar routing network. The small squares (one of which is identified at reference numeral 24) disposed at the intersections of first ones of the interconnect conductors shown in FIG. 2 running vertically in the routing network 22 and second ones of the interconnect conductors shown in FIG. 2 running horizontally in the routing network 22 are user-programmable elements as is known in the art of FPGAs. The user-programmable elements can be one-time programmable elements such as antifuse or can be one of a number of different re-programmable elements, such as non-volatile transistors, known in the art. Programmable connections can be made from the respective charge-to-pulse-width converter circuits 18 through the inverters 20 and routing network 22 to the word line 14 (W) inputs W1, W2 . . . Wn of the next one of the matrix vector multipliers 12a, 12b, . . . 12n in the cascaded chain.

Figure 3:
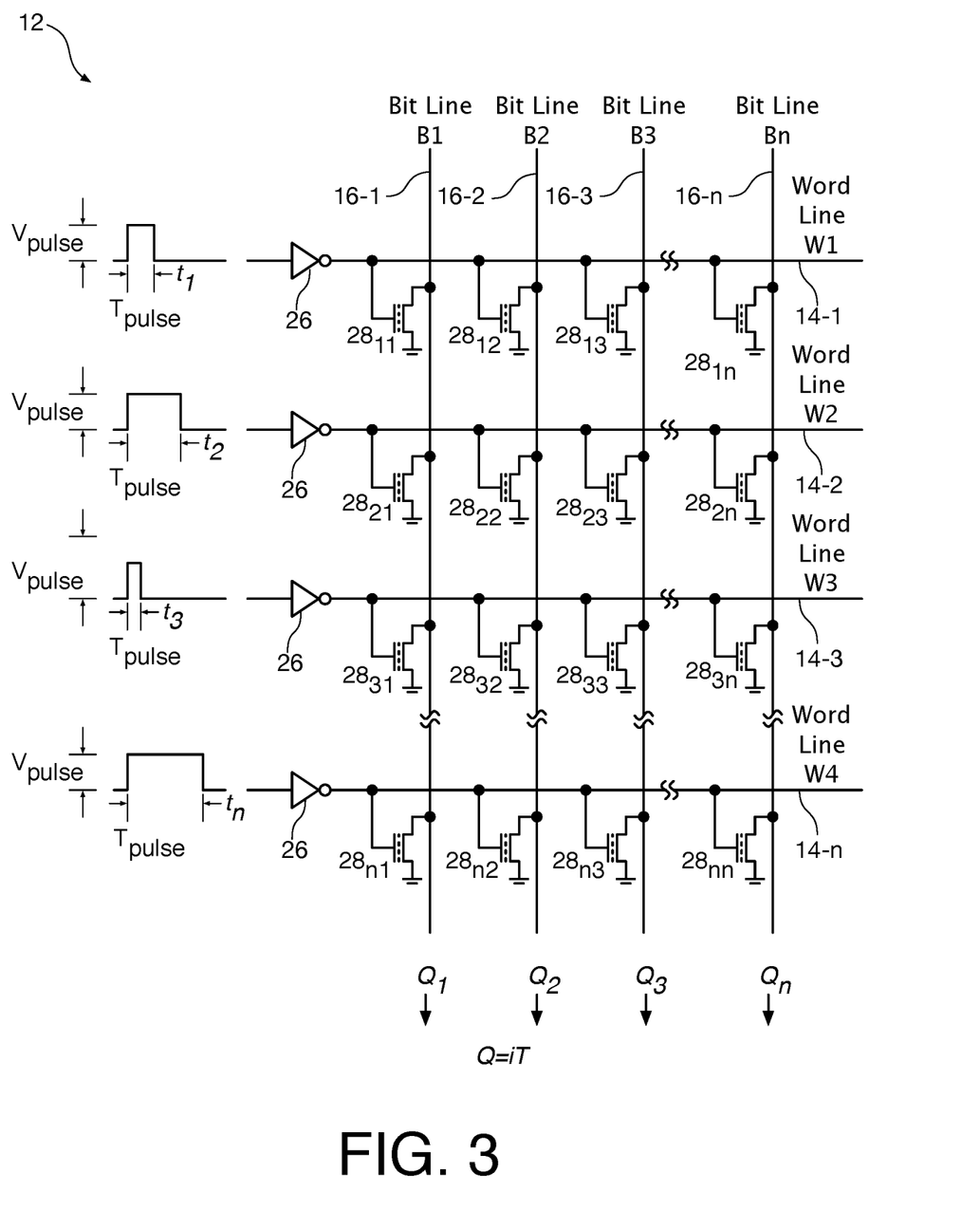
FIG. 3 is a diagram of an illustrative matrix vector multiplier unit that may be employed in the present invention.

Referring now to FIG. 3, a schematic diagram shows details of one of the matrix vector multipliers 12a, 12b, . . . 12n. Bit lines 16-1 through 16-n and word lines 14-1 through 14-n form the matrix. An input buffer in the form of an inverter 26 buffers the respective input signals to each of the word lines 14 (W) inputs W1, W2 . . . Wn. The output inverters 20 of the respective charge-to-pulse-width converter circuits 18 and the respective input inverters 26 in the matrix vector multipliers 12a, 12b, . . . 12n together assure that the signals on each of the word lines 14 (W) inputs W1, W2 . . . Wn are uninverted from the outputs of the charge-to-pulse-width converter circuits 18. For simplicity the word lines 14 are defined herein as being after the respective inverter 26.

A programmable Vt transistor 28 such as a floating gate or silicon-oxide-nitride-oxide-silicon (SONOS) transistor is disposed at the intersection of each bit line and word line of the matrix vector multiplier 12 with the drain of the programmable Vt transistor connected to the respective matrix vector multiplier 12 bit line 16, the gate of the programmable Vt transistor connected to the respective matrix vector multiplier 12 word line 14 and its source connected to a fixed potential, for example ground. Each programmable Vt transistor is identified by reference numeral 28xy, where x and y are the respective intersecting word line and bit line to which the transistor is connected. Methods of programming such programmable Vt transistors are known in the art and involve applying different potentials to the bit lines and word lines of the programmable Vt transistors depending on the nature of the storage mechanism employed by the transistor to alter its Vt.

The inputs to the matrix vector multiplier 12 at the word lines 18-1 through 18-n are digital pulses. All of the digital pulses have the same amplitude $V_{pulse}$. Each pulse has an individual pulse width, shown in FIG. 3 as t1, t2, t3, and tn. The individual pulse widths each represent the different analog values that are to be computed by the matrix vector multiplier. Each of the transistors 28xy is programmed to one of a possible number of digital states, for example 1 of 256, by programming its floating gate as described in U.S. Patent Application Publication 2017/0337466, which application is incorporated herein by reference in its entirety.

When the matrix vector multipliers 12a, 12b, . . . 12n receive the respective $V_{pulse}$ signals on the word lines 18-1 through 18-n, each of the transistors 28xy individually conduct an amount of current proportional to the extent to which its floating gate has been programmed for the length of the pulse. The $V_{pulse}$ signals for each of the matrix vector multipliers 12a, 12b, . . . 12n are generated simultaneously from the upstream one of the matrix vector multipliers 12a, 12b, . . . 12n in the cascaded arrangement. For example, referring again to FIG. 2, the $V_{pulse}$ signals presented on the word lines W1 through Wn of the matrix vector multiplier 12b (shown at reference numerals 14-1 through 14-n in FIG. 3) are generated by the charge-to-pulse-width converter circuits 18 at the bit line 16a outputs B1 through Bn of the matrix vector multiplier 12a. Each charge-to-pulse-width converter circuits 18 is configured to generate a digital pulse having a pulse width proportional to an analog quantity to be input to a neural network including at least the second matrix vector multiplier 12b.

Inputs for first matrix vector multiplier 12a may be similarly provided by a charge-to-pulse-width converter circuits 18 of a previous matrix vector multiplier, or by another signal source providing input pulses for use by first matrix vector multiplier 12a as will be described further below in relation to FIG. 6. In one embodiment, the word lines 14-1 through 14-n of a first one of the matrix vector multipliers (the matrix vector multiplier 12a depicted in FIG. 2) in a neural network including a plurality of cascaded matrix vector multipliers 12a, 12b, . . . 12n are each coupled to a different pulse generator circuit to provide the $V_{pulse}$ signals for its word lines W1 through Wn. Exemplary pulse generator circuits are discussed with reference to FIG. 7A and FIG. 7B The current flowing through each of the transistors 28xy during the active portions of the Vpulse signals at times $t_1$, $t_2$, $t_3$, . . . $t_n$ results in a total charge accumulating on each of the bit lines 16 that is the sum of the individual currents flowing through the transistors 28 connected to that bit line. These charges are represented by individual charges Q1, Q2, Q3, . . . Qn shown at the bottom of FIG. 3.

Figure 4:
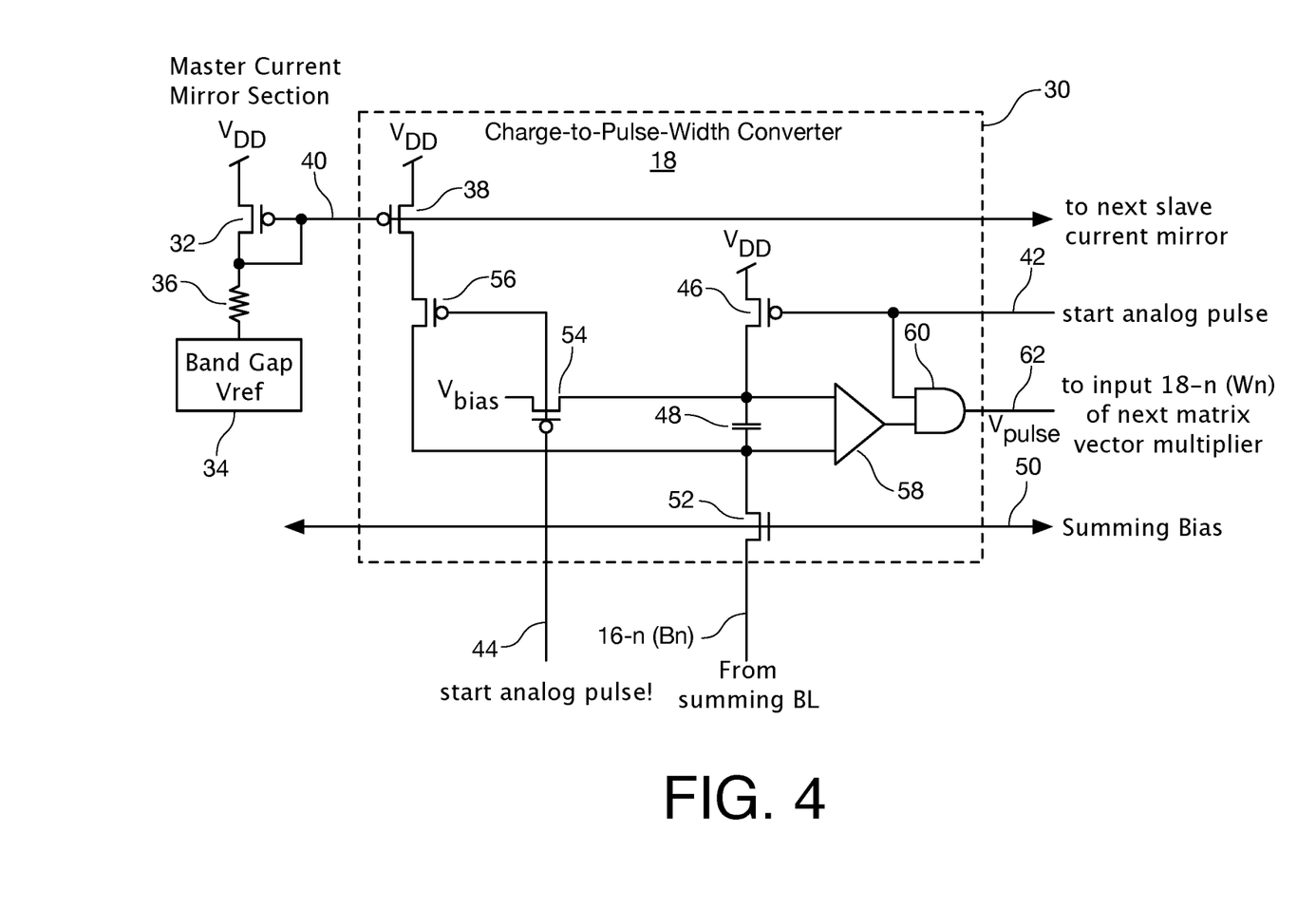
FIG. 4 is a schematic diagram of an illustrative charge-to-pulse-width converter circuit that may be employed in the present invention.
Figure 5:
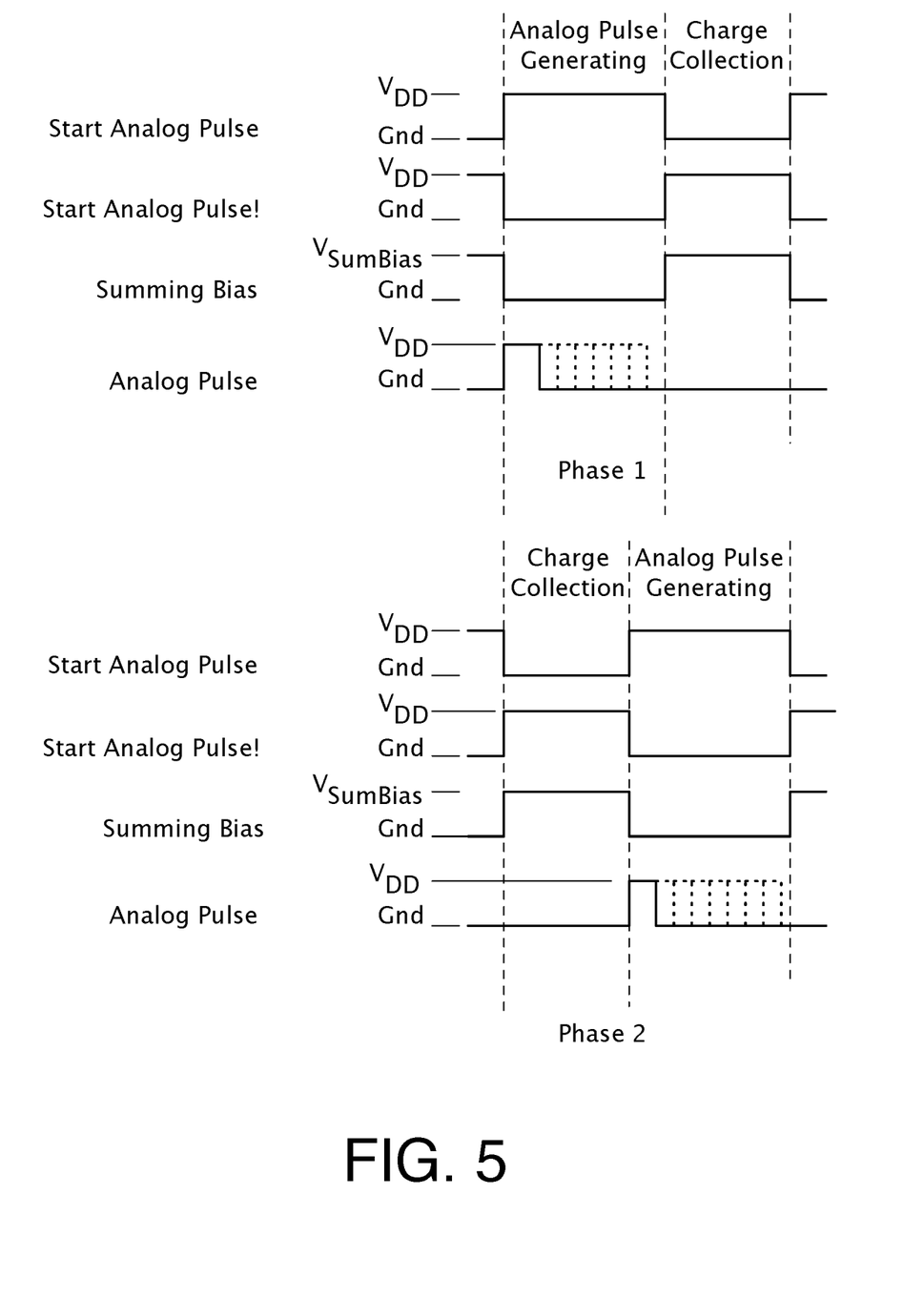
FIG. 5 is a timing diagram showing operation of the matrix vector multiplier of FIG. 3 and the charge-to-pulse-width converter circuit of FIG. 4.

Referring now to FIG. 4, a schematic diagram shows an illustrative charge-to-pulse-width converter circuit 18 that may be employed in a neural network system 10 in accordance with the present invention. The portion of the circuit shown in FIG. 3 that forms the charge-to-pulse-width converter circuits 18 is shown within dashed lines 30. It is also useful to view FIG. 5 in conjunction with FIG. 4. FIG. 5 is a timing diagram showing operation of the charge-to-pulse-width converter circuit 18 of FIG. 4 and the matrix vector multiplier of FIG. 3 in an embodiment where the charge-to-pulse-width converter circuits 18 associated with respective matrix vector multipliers 12 operate in two different time frames, with the top of FIG. 5 referred to as Phase 1, where the analog pulse is generated during a first time period, followed by a charge collection period, and the bottom of FIG. 5 referred to as Phase 1, where the charge collection period is during the first time period, followed by the analog pulse generation period. During a charge collection time frame the charge-to-pulse-width converter circuits 18 collect charge from the bit lines 16 of the associated matrix vector multipliers 12a, 12b, . . . 12n that they are connected to in the cascaded arrangement. During an analog pulse generating time frame, the charge-to-pulse-width converter circuits 18 generate $V_{pulse}$ signals having pulse widths proportional to the amount of charge that was collected during the charge collection time frame from the bit lines of the associated one of the matrix vector multipliers 12a, 12b, . . . 12n in the cascaded arrangement. Because of this operation, the charge-to-pulse-width converter circuits 18 in successive ones of the matrix vector multipliers 12a, 12b, . . . 12n in the cascaded arrangement operate out of phase with one another, meaning that while the charge-to-pulse-width converter circuits 18 associated with any one of the matrix vector multipliers 12a, 12b, . . . 12n is operating in the charge collection time frame, the charge-to-pulse-width converter circuits 18 associated with the matrix vector multipliers 12a, 12b, . . . 12n both upstream and downstream in the cascaded chain are operating in the analog pulse generating time frame. According to another aspect of the invention, the control signals can be timed to operate the cascaded chain of the matrix vector multipliers 12a, 12b, . . . 12n in a rippled manner, with each one of the matrix vector multipliers 12a, 12b, . . . 12n in the cascaded chain waiting until the matrix vector multiplier 12a, 12b, . . . 12n immediately upstream in the cascaded chain has completed its operations in both the charge collection time frame and the analog pulse generating time frame.

A neural network system 10 according to the present embodiments will include a plurality of charge-to-pulse-width converter circuits 18. A master-slave current mirror system is usefully employed to assure uniformity of operation of all of the charge-to-pulse-width converter circuits 18. A master portion of the master-slave current mirror circuit includes a p-channel transistor 32 coupled to a band gap reference voltage generating circuit 34 generating the voltage $V_{ref}$ through a resistor 36. The master portion of the master-slave current mirror circuit is not part of any one of the charge-to-pulse-width converter circuits 18 but can be common to as many as is desired of the charge-to-pulse-width converter circuits 18 in the neural network system 10.

A slave portion of the master-slave current mirror circuit is formed from p-channel transistor 38 having its gate connected to the gate of p-channel transistor 32 in the master section over line 40. Line 40 is provided to all of the charge-to-pulse-width converter circuits 18 in the neural network system 10.

A complementary pair of control signals identified as start-analog-pulse on line 42 and start-analog-pulse! on line 44 are used to control the charge-to-pulse-width converter circuits 18 in the neural network system 10.

When the start analog pulse line 42 goes low to start the charge collection time frame, transistor 46 turns on and places VDD at the top plate of capacitor 48, which in one embodiment of the invention may be a metal-insulator-metal (MIM) capacitor. The summing bias line 50 connected to the gate of n-channel transistor 52 is set to active (high) so as to turn on n-channel transistor 52 and as a result the charge on each bit line 16 begins to charge the capacitor 48 by pulling down the voltage on its bottom plate through n-channel transistor 52 whose drain is connected to the bottom plate of capacitor 48. The voltage level at the summing bias line 50 is set to limit the maximum voltage that will be applied to any bit line 16 through the transistor 52 (connected as a source follower) independent of the charge accumulated on the capacitor 48.

The programmable Vt transistor 28xy in the matrix vector multiplier of FIG. 3 begin to supply charge to the respective bit lines 16-1 through 16-n at a rate that is the sum of the conduction of all of the floating gates of the transistors 28xy connected to each bit line during the time each respective $V_{pulse}$ signal is active. Thus the sum of the currents are collected on each of the respective bit lines 16-1 through 16-n and drive the source of the respective transistor 52 to which they are directly connected slightly more negative, turning it on to collect all the charge on the capacitor 48. Because transistor 52 is running in saturation due to the voltage level at the summing bias line 50 its source current is not modulated by the bias on its drain (the voltage on the capacitor 48).

The change of the voltage on the summing bit lines 16 is minimal because the transistors 28xy are operating in saturation due to the height of $V_{pulse}$ and the drain-to-source current flowing through transistors 28xy is insensitive to drain-to-source voltage changes, but is instead a function of the respective Vt of the transistors 28xy. This combined with running the programmable Vt transistors 28xy in saturation means that any change in the drain current through the programmable Vt transistors 28xy as a function of change in voltage at the summing bit line is insignificant. This eliminates the need for an operational amplifier to maintain a constant bias.

Prior to asserting the $V_{pulse}$ signals on the word lines 14-1 through 14-n and the summing bias signal on summing bias line 50, the bit lines 16-1 through 16-n are allowed to settle to the minimum leakage bias that is a result of no pulse current flowing through transistor 52. After the end of the $V_{pulse}$ signals, the summing bit lines 16-1 through 16-n are again allowed to settle to the minimum leakage bias so that the summing bit lines 16-1 through 16-n are at the same potential at the beginning of the $V_{pulse}$ signals and after the end of the $V_{pulse}$ signals thereby eliminating any error of electron charge accumulating on the summing bit line.

During the charge collection time frame, the start analog pulse! line 44 is high and p-channel transistors 54 and 56 are turned off. The potential at the bottom plate of capacitor 48 decreases as the capacitor 48 is charged from the summing bit line 16 by current flow through the respective programmable Vt transistors 28xy.

At the end of the charge collection time frame, the start analog pulse line 42 goes high, turning off p-channel transistor 46. The summing bias line 50 is set to inactive (low), turning off n-channel transistor 52. The complementary start analog pulse line! 44 goes low, turning on p-channel transistors 54 and 56.

The p-channel transistor 54 applies the voltage potential $V_{bias}$ to the top plate of capacitor 48, which is no longer connected to VDD. As will be appreciated by persons of ordinary skill in the art, the voltage at the bottom plate of the capacitor 48, representing the charge accumulated from the bit line, has been shifted downwardly from VDD by the above actions and is now referenced to the voltage $V_{bias}$. In one instance of the invention $V_{bias}$ is set to be less than VDD by about 2 Vt of the transistors from which the comparator 58 is formed in order to provide voltage headroom for the comparator 58 to function properly.

The p-channel transistor 56 connects the bottom plate of the capacitor 48 to the slave current source p-channel transistor 38, which starts discharging the capacitor 48 through transistor 56 at a constant current. A comparator 58 is connected across the capacitor 48. The reason that the potential at the top plate of the capacitor is preferably set to $V_{bias}$ is that the performance of the comparator 58 is compromised when one of the inputs of the comparator 58 is at the voltage rail potential VDD. In addition, setting the voltage at the top plate of the capacitor 48 at $V_{bias}$ prevents the drain of the slave transistors 38 in the current mirrors from going any higher below the source voltage of the slave current mirror transistor 38 by about 2 Vt of the lave current mirror transistor 38, thus keeping the slave current mirror transistors 38 in saturation mode.

The comparator 58 will trip and its output will become low when the voltage across the capacitor reaches zero. AND gate 60 has one input connected to the output of the comparator 58 and the other input connected to the start analog pulse line 42. Because the output of the comparator is high when the capacitor 48 has any voltage across it, the output 62 of the AND gate will become high when the start analog pulse line 42 goes high and there is voltage across capacitor 48. The output of AND gate 60 will be thus high until the comparator trips. The output of the AND gate 60 is the signal $V_{pulse}$ that will be presented to one of the word lines 14-1 through 14-n of the next matrix vector multiplier downstream in the cascade chain via the respective input inverting buffers 26.

Figure 6:
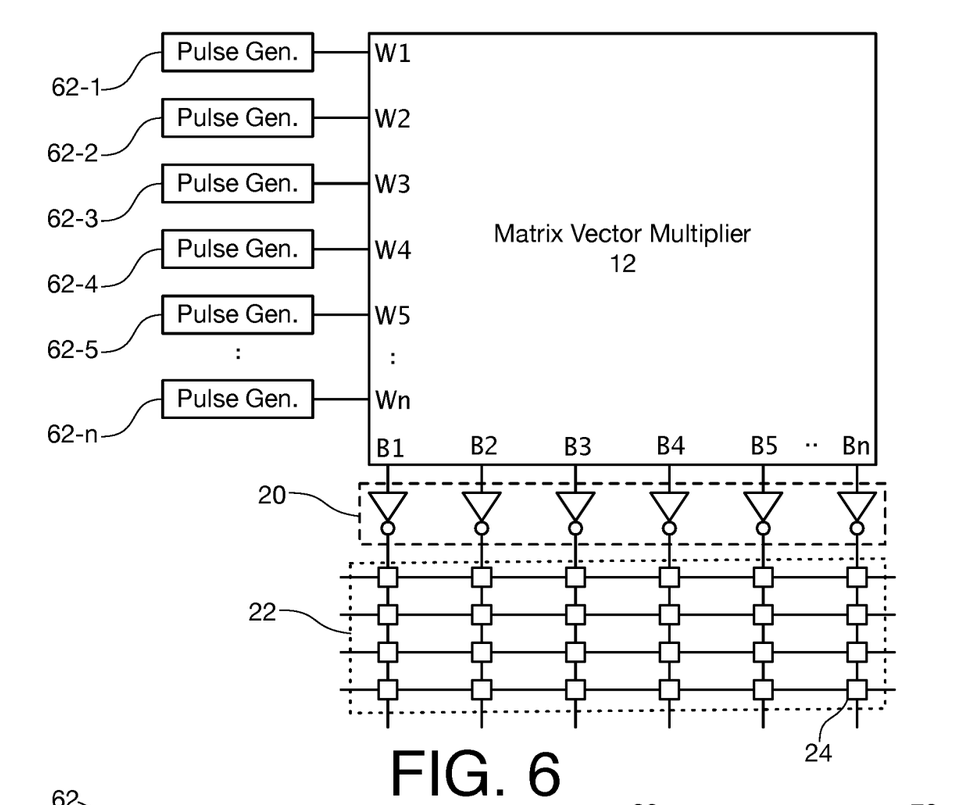
FIG. 6 is a block diagram of a first matrix vector multiplier circuit in a neural network of matrix vector multiplier circuits.

Referring now to FIG. 6, a block diagram shows a first matrix vector multiplier circuit in a neural network of matrix vector multiplier circuits. The matrix vector multiplier circuit depicted in FIG. 6 includes many of the circuit elements in the matrix vector multiplier circuits depicted in FIG. 2. Those elements will be identified using the same reference numerals identifying the corresponding elements in FIG. 2.

The first matrix vector multiplier circuit 12 in a neural network can obtain its word line 14 inputs W1 through Wn from pulse generator circuits 62-1 through 62-n. It presents outputs on summing bit lines B1 through Bn through inverting buffers 20 to a programmable routing network identified within dashed lines 22. The small squares (one of which is identified at reference numeral 24) disposed at the intersections of the interconnect conductors are user-programmable elements as is known in the art of FPGAs.

Figure 7A:
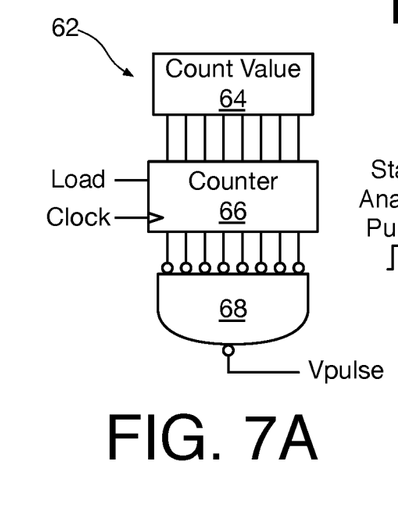
FIG. 7A is a diagram of an illustrative digital pulse-generator circuit suitable for use in the present invention.

FIG. 7A is a circuit diagram of an illustrative pulse-generator circuit 62 suitable for use in generating pulses for a first matrix vector multiplier circuit in a neural network of matrix vector multiplier circuits in accordance with the present invention. A register or memory element 64 stores a count value. A load pulse causes the count value to be loaded into a down counter 66 that counts down to zero. When the count value is loaded into the counter 66, its non-zero value causes the output of the AND gate 68 at $V_{pulse}$ to assume a logic one state. The output of the AND gate 68 maintains its logic one state until the count from the counter 66 reaches zero, when it assumes a logic low state. The counter is configured to stay at a zero count until the next load pulse is received. As a result, the output of AND gate 68, Vpulse, remains in the active state for the number of clock pulses of the loaded count value.

Figure 7B:
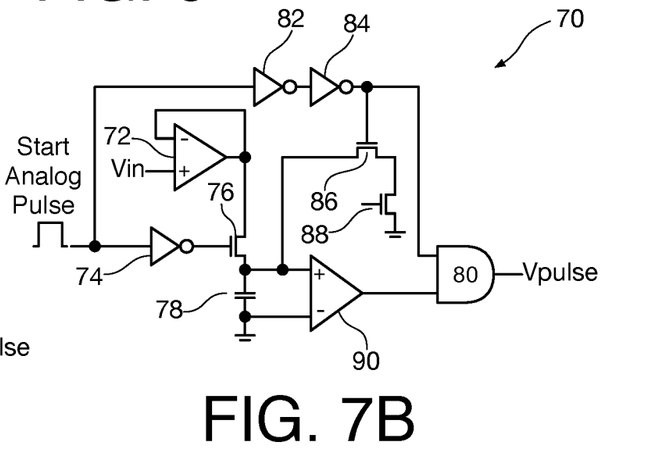
FIG. 7B is a diagram of an illustrative analog pulse-generator circuit suitable for use in the present invention.

Referring now to FIG. 7B, a diagram shows an illustrative analog pulse-generator circuit 70 suitable for use in generating pulses from an analog voltage input Vin for a first matrix vector multiplier circuit in a neural network of matrix vector multiplier circuits in accordance with the present invention.

An operational amplifier 72 is configured as a voltage follower amplifier. The circuit is controlled by the start analog pulse signal shown in FIG. 5. When the start analog pulse signal is low, inverter 74 turns n-channel transistor 76 to charge capacitor 78 to Vin. The output of AND gate 80 (the $V_{pulse}$ output of the analog pulse-generator circuit 70) is low because inverters 82 and 84 place a logic low state on the first input of AND gate 80.

When the start analog pulse signal goes high, inverter 74 turns n-channel transistor 76 off Inverters 82 and 84 turn on transistor 86 that begins to discharge the capacitor 78 at a constant current through n-channel transistor 88 whose gate is biased by the current mirror of FIG. 4. The inverters 82 and 84 also place a logic one at first input to the AND gate 80 whose output goes high because the output of the comparator 90 places a logic high level at the second input of the AND gate 80 and voltage across capacitor 78 is not zero. The output of the AND gate 80 stays at a logic high level until the capacitor 78 discharges and flips the state of the inverter 90. The output Vpulse is therefore of a length which reflects the value of Vin, the capacitance of capacitor 78 and the value of the current of the current mirror of FIG. 4.

Conversion from voltage to time in accordance with the present invention employs a capacitor charged to an analog voltage that is discharged by a current source and generates a timing pulse triggered by a comparator coupled to the capacitor. All of these elements are simple small circuits. The reverse is then used in the matrix vector multipliers in the next stage to convert the cumulative sums of charge generated by the timing pulses back to an analog voltage. Additional circuits can be added for more speed and accuracy.

A word line is pulsed with the analog time pulse at a constant voltage with the multiplier weight coming from the Vt setting on a non-volatile transistor and eliminates the four decades of linearity required for some alternative solutions like the one shown in FIG. 1. This eliminates the input conversion and reduces errors while giving the desired function with a single applied voltage.

Figure 8:
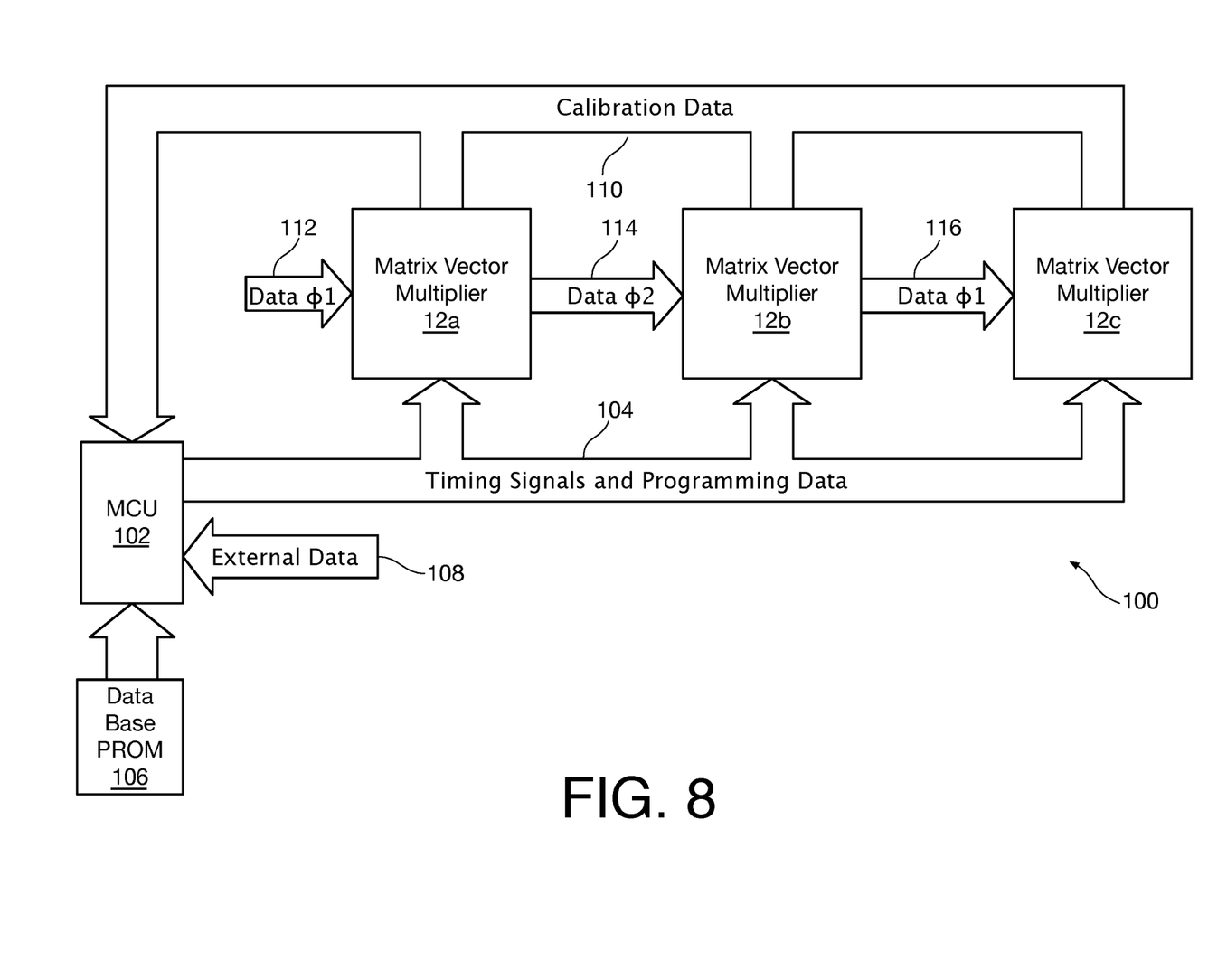
FIG. 8 is a block diagram of a control system for generating timing signals and for performing calibration of a plurality of matrix vector multipliers in accordance with an aspect of the present invention.

Referring now to FIG. 8, a block diagram depicts a control system 100 for generating timing signals and for performing calibration of a plurality of matrix vector multipliers in accordance with an aspect of the present invention.

The control system 100 is described with reference to an illustrative group of three cascaded matrix vector multipliers identified by reference numerals 12a, 12b, and 12c. Persons of ordinary skill in the art will appreciate that the control system 100 depicted in FIG. 8 can accommodate various numbers of cascaded matrix vector multipliers.

A microcontroller 102 directs the operation of the control system 100. The microcontroller 102 generates the phase 1 and phase 2 control signals depicted in the timing diagram of FIG. 5 and provides them to the matrix vector multipliers 12a, 12b, and 12c over a bus 104. Bus 104 also carries the programming data generated by the microcontroller 102 to set the weights of the non-volatile memory transistors 28 (FIG. 3) in the matrix vector multipliers 12a, 12b, and 12c. The microcontroller 102 can obtain data from a database PROM 106 which can also be used to store the microcode that is run in the microcontroller 102. The microcontroller 102 can also obtain data from external sources as indicated by bus 108.

Bus 110 carries calibration data from each of the matrix vector multipliers 12a, 12b, and 12c back to the microcontroller 102 where it can be compared to data stored in the database PROM 106 to develop correction programming parameters to trim the weight values stored in the non-volatile memory transistors 28 in the matrix vector multipliers 12a, 12b, and 12c. The outputs may be taken from the outputs of the charge-to-pulse width converters 18 or the buffers 20 shown in FIG. 2. Since the outputs of the matrix vector multipliers 12a, 12b, and 12c are in the form of digital pulses of varying duration, the microcontroller 102 can evaluate the outputs of the matrix vector multipliers 12a, 12b, and 12c without the need for the system to perform analog to digital conversion.

As shown in FIG. 8, the data is presented to alternate ones of the matrix vector multipliers 12a, 12b, and 12c during phase 1 and phase 2 time periods as indicated by the timing diagram of FIG. 5 in which the matrix vector multiplier 12a receives data from an input bus 112 during phase 1, the matrix vector multiplier 12b receives data from the output of the matrix vector multiplier 12a on bus 114 during phase 2, and the matrix vector multiplier 12c receives data from the output of the matrix vector multiplier 12b on bus 116 during phase 1.

Figure 9:
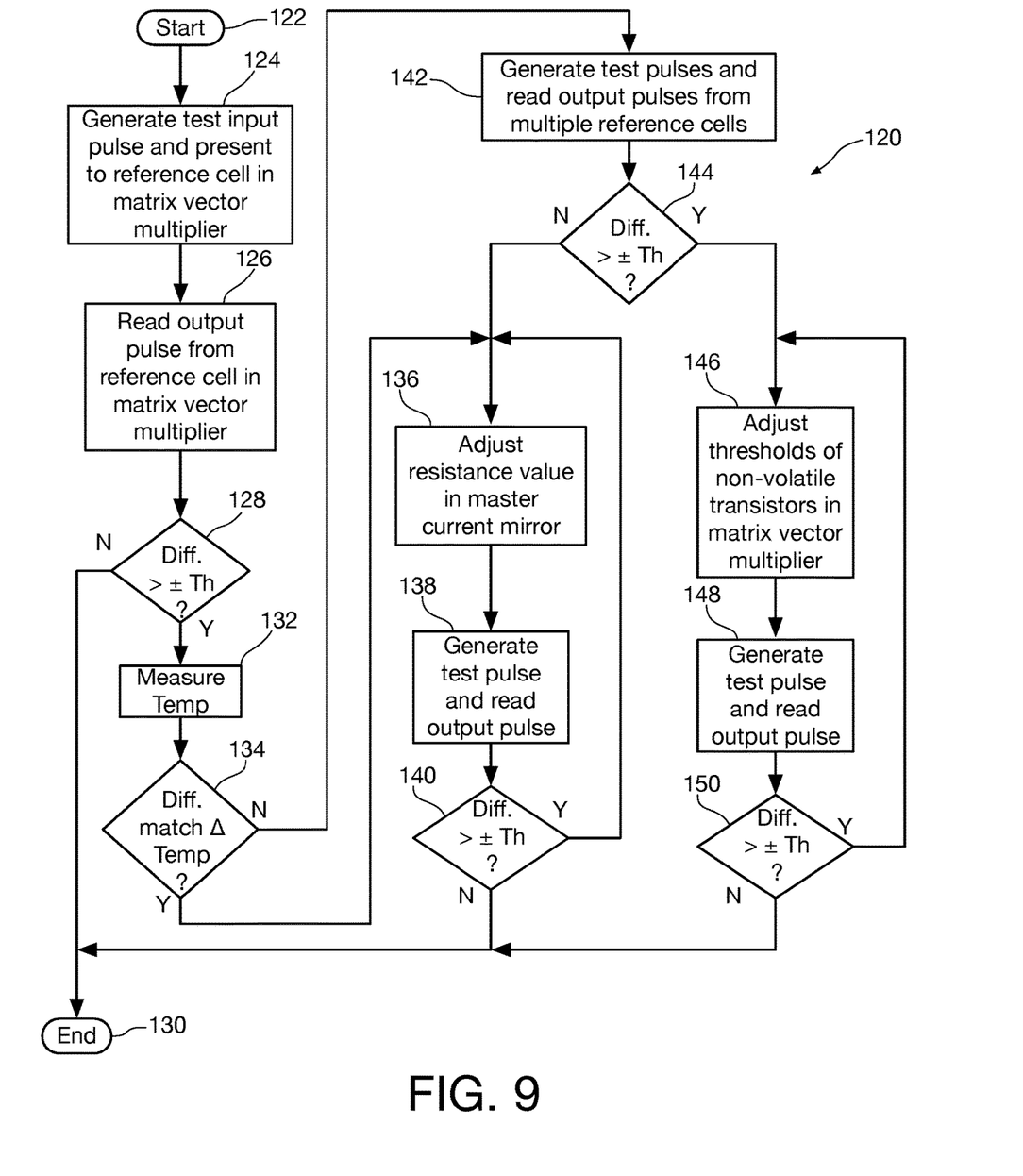
FIG. 9 is a flow diagram depicting a method for calibrating the outputs of the matrix vector multipliers in accordance with the present invention.

Referring now to FIG. 9, a flow diagram depicts a method 120 for calibrating the outputs of the matrix vector multipliers in accordance with the present invention. The method begins at reference numeral 122.

At reference numeral 124 the microcontroller 102 of FIG. 8 generates a test input pulse of known duration and presents it over the bus 104 of FIG. 8 to a reference cell in the matrix vector multiplier to be calibrated. At reference numeral 126 the output pulse is read from the matrix vector multiplier over bus 110. At reference numeral 128 the microcontroller 102 determines whether the duration of the returned pulse matches the expected value of the input pulse multiplied by the weight programmed into the non-volatile transistor in the matrix vector multiplier through which it passed. If the difference between the returned duration value and the expected return duration value is less than a predetermined threshold, the matrix vector multiplier is assumed to be calibrated and the method proceeds to reference numeral 130 where it ends.

If at reference numeral 128 it is determined that the difference between the returned duration value and the expected return duration value is greater than the predetermined threshold, the method proceeds to reference numeral 132 where the temperature of the integrated circuit is sensed. The method proceeds to reference numeral 134 where it is determined whether the difference in pulse duration measured at reference numeral 128 matches a difference that is expected given the measured temperature rise. If the difference in pulse duration measured at reference numeral 128 matches the expected difference a correction can be made by adjusting the value of the resistor 36 in the master current mirror section shown in FIG. 3 and the method proceeds to reference numeral 136 where the resistance value of the resistor 36 in the master current mirror section depicted in FIG. 3 is adjusted to compensate for the measured difference in pulse duration.

At reference numeral 138 another test pulse is generated and the duration of an output pulse from the matrix vector multiplier is compared with the expected value at reference numeral 140. If the difference between the actual output pulse duration and the expected output pulse duration is below a predetermined threshold, the matrix vector multiplier is considered to be calibrated and the method ends at reference numeral 130. If the difference between the actual output pulse duration and the expected output pulse duration is above the predetermined threshold, the processes performed at reference numerals 136 and 138 are repeated in a loop until the matrix vector multiplier is considered to be calibrated and the method ends at reference numeral 130.

If at reference numeral 134 the difference in output pulse duration measured at reference numeral 128 does not match the expected difference the method proceeds to reference numeral 142 where multiple test pulses are generated and presented to multiple reference cells in the matrix vector multiplier. At reference numeral 144 it is determined whether the differences between the output pulses from the multiple reference cells in the matrix vector multiplier and the expected values exceed threshold values. If the differences between the output pulses from the multiple reference cells in the matrix vector multiplier and the expected values do not exceed threshold values the method proceeds to reference numeral 136 the operation of which has been previously described.

If the differences between the output pulses from the multiple reference cells in the matrix vector multiplier and the expected values exceed threshold values a decision is made that the non-volatile transistors in the matrix vector multiplier need to be re-programmed to adjust their thresholds and the method proceeds to reference numeral 146 where a programming procedure is performed to adjust thresholds of the non-volatile transistors in the matrix vector multiplier. At reference numeral 148 another series of test pulses is generated and the duration of output pulses from the matrix vector multiplier are compared with the expected values at reference numeral 150 to verify the threshold adjustments of the non-volatile transistors in the matrix vector multiplier. If the differences between the duration of the output pulses from the matrix vector multiplier and the expected values are below a predetermined threshold, the matrix vector multiplier is considered to be calibrated and the method ends at reference numeral 130. If the differences between the actual output pulse durations and the expected output pulse durations are above the predetermined threshold, the processes performed at reference numerals 146 and 148 are repeated in a loop until the matrix vector multiplier is considered to be calibrated and the method ends at reference numeral 130.

Persons of ordinary skill in the art will understand that the programming of the non-volatile transistors in the matrix vector multipliers can be accomplished using the part of the flow diagram of FIG. 9 shown at reference numerals 146, 148, and 150.

Circuit delays are not important, but pulse width is important. Therefore design considerations need to treat the entire NET (the entire signal path from generation of $V_{pulse}$ to the memory formed from transistors 28xy) as a transmission line in order to avoid altering the widths of the $V_{pulse}$ signals. Analog values are transmitted through digital programmable routing using single variable-length pulses representing the analog value. The pulse width is converted to charge in an analog matrix-vector multiplier 12, and the charge is converted back to a variable-length pulse for the next input. Persons of ordinary skill in the art will appreciate that it is not necessary to limit the pulse to a single pulse as it is possible to provide several pulses as long as they all occur during the analog time pulse frame and the pulse width total of all of the individual pulses is equivalent to the desired analog value.

A specific application can be tuned by measuring output pulse width versus input pulse width while programming the non-volatile memory transistors 28xy, thereby nulling any errors in Vt of the current mirror transistors 32 and 38 and the non-volatile memory transistors 28xy. This might speed up device training.

An on board PROM can be employed to hold the time values of the $V_{pulse}$ signals such that an onboard controller could self tune the chip against a precision clock by comparing the widths of the output $V_{pulse}$ signals to the stored time values.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for implementing a neural network system in an integrated circuit comprising:
   presenting first digital pulses to word line inputs of a matrix vector multiplier including a plurality of word lines, the word lines forming intersections with a plurality of summing bit lines, a programmable Vt transistor at each intersection having a gate connected to the intersecting word line, a source connected to a fixed potential and a drain connected to the intersecting summing bit line, each first digital pulse having a pulse width proportional to an analog quantity;
   during a charge collection time frame summing charge collected on each of the summing bit lines from current flowing in the programmable Vt transistor; and
   during a pulse generating time frame generating second digital pulses having pulse widths proportional to the amount of charge that was collected on each summing bit line during the charge collection time frame.

2. The method of claim 1 wherein:
   summing charge collected on each of the summing bit lines from current flowing in the programmable Vt transistor comprises storing summed charge in a capacitor coupled to each of the summing bit lines; and
   generating second digital pulses having pulse widths proportional to the amount of charge that was collected on each summing bit line during the charge collection time frame comprises generating second digital pulses having pulse widths with durations determined by discharging the capacitors at a constant current rate.

* * * * *